United States Patent
Yen (10) Patent No.: US 10,648,611 B2
(45) Date of Patent: May 12, 2020

(54) DISPLAY STAND

(71) Applicant: SYNCMOLD ENTERPRISE CORP., New Taipei (TW)

(72) Inventor: Ching-Hui Yen, New Taipei (TW)

(73) Assignee: Syncmold Enterprise Corp., New Taipei (TW)

( * ) Notice: Subject to any disclaimer, the term of this patent is extended or adjusted under 35 U.S.C. 154(b) by 0 days.

(21) Appl. No.: 16/414,346

(22) Filed: May 16, 2019

(65) Prior Publication Data

US 2019/0271434 A1 Sep. 5, 2019

Related U.S. Application Data

(63) Continuation of application No. 15/696,581, filed on Sep. 6, 2017, now Pat. No. 10,344,909.

(Continued)

(30) Foreign Application Priority Data

Nov. 3, 2016 (TW) .............................. 105216808 A (51) Int. Cl.
*F16M 11/00* (2006.01)
*F16M 11/04* (2006.01)
(Continued)

(52) U.S. Cl.
CPC ........... *F16M 11/046* (2013.01); *F16M 11/24* (2013.01); *H05K 5/0234* (2013.01); *F16M 2200/08* (2013.01)

(58) Field of Classification Search
CPC ....... F16M 11/046; H05K 5/0234; A47B 5/04
See application file for complete search history.

(56) References Cited

U.S. PATENT DOCUMENTS

| 7,942,579 | B2 | 5/2011 | Shirai |
| 2018/0112817 | A1* | 4/2018 | Bax ...................... F16M 11/046 |

(Continued)

FOREIGN PATENT DOCUMENTS

| CN | 203375119 U | 1/2014 |
| CN | 203586500 U | 5/2014 |

*Primary Examiner* — Amy J. Sterling
(74) *Attorney, Agent, or Firm* — Muncy, Geissler, Olds & Lowe, P.C.

(57) ABSTRACT

A metal extrusion plate for a display stand and the display stand are provided. The metal extrusion plate extends along a first direction and comprises N of flat plate sections and N−1 of connecting sections, wherein the flat plate sections are integrally formed with the connecting sections, and N is a positive integer greater than 1. The flat plate sections are interlaced with the connecting sections, and each of the connecting sections is connected to the two adjacent flat plate sections therebetween. Each of the connecting sections has a groove extending along a second direction being perpendicular to the first direction and forming a first incline and a second incline opposite to the first incline. The metal extrusion plate is capable of being bent at the connecting section so that the two adjacent flat plate sections form a first included angle. The metal extrusion plate is bent to form as a supporting frame to be disposed on a base. The flat plate sections and the connecting sections encompass and form a receiving space for an elevating module disposed therein so as to move up and down with respect to the supporting frame.

20 Claims, 8 Drawing Sheets

Related U.S. Application Data

(60) Provisional application No. 62/399,905, filed on Sep. 26, 2016.

(51) Int. Cl.
  *F16M 11/24* (2006.01)
  *H05K 5/02* (2006.01)

(56) References Cited

U.S. PATENT DOCUMENTS

2018/0168334 A1\* 6/2018 Swartz .................. A47B 5/04
2019/0226629 A1\* 7/2019 Chen ................... F16M 11/046

\* cited by examiner

DISPLAY STAND

CROSS REFERENCE TO RELATED APPLICATION

This application is a continuation application of U.S. application Ser. No. 15/696,581 filed on Sep. 6, 2017. The U.S. application Ser. No. 15/696,581 claims the benefit of U.S. Provisional Application Ser. No. 62/399,905 filed on Sep. 26, 2016, and the benefit of Taiwan Patent Application Serial No. 105216808 filed on Nov. 3, 2016. The entirety of each said application is incorporated herein by reference.

BACKGROUND OF THE INVENTION

1. Field of the Invention

The present invention relates to a metal extrusion plate and a display stand including the metal extrusion plate being bent as a supporting frame. More specifically, the present invention relates to a stand for holding a display.

2. Description of Related Art

Figure 1:
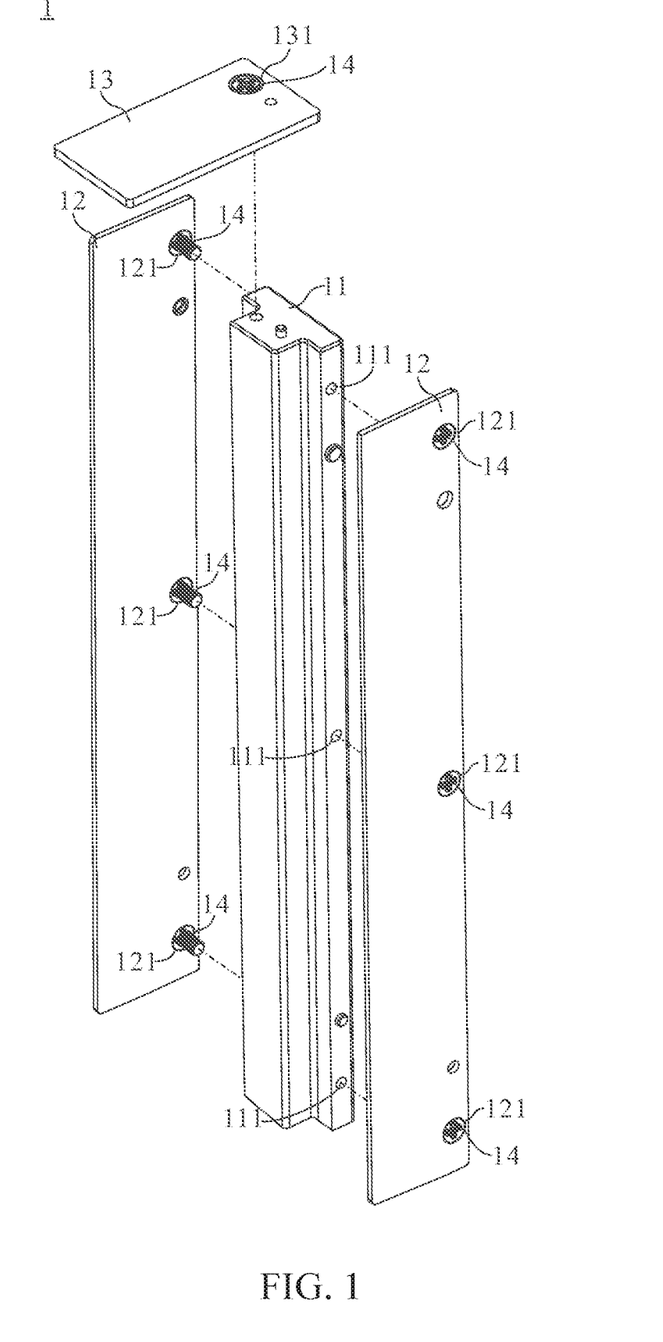
FIG. 1 is a schematic view illustrating a conventional stand.

A conventional stand for a display is shown in FIG. 1. A plurality of boards are individually formed by pressing and then be secured to each other to assemble the stand 1. As shown in FIG. 1, the stand 1 includes a main board 11, two side boards 12, and a top board 13. The main board 11 is formed with a plurality of screw holes 111. The side boards 12 and the top board 13 are formed with a plurality of holes 121 and 131. A plurality of screws 14 are capable of passing through the holes 121 and 131, and then be secured in the screw holes 111 so as to fasten the side boards 12 and the top board 13 to the main board 11. However, the conventional stand 1 has disadvantages of being structurally complex and bulky. Furthermore, the plates or boards should have certain thickness in the manner of fastening with the screws, which is unfavorable in the trend of having the slim stand.

In another aspect, the conventional stand is not possible to be integrally formed because a single and large mold for manufacturing a conventional stand is too expensive and lacks production efficiency.

Given the above, it is desirable to provide an improved display stand to have a slim structure with low manufacturing costs.

SUMMARY OF THE INVENTION

One objective of the present invention is to provide a display stand which has a slim structure and is capable of minimizing the unfavorable visual effect occupied by the stand from the view of the user.

Another objective of the present invention is to provide a metal extrusion plate for the display stand. The metal extrusion plate is capable of being bent as a supporting frame of the display stand. Merely a small mold can be used to manufacture the metal extrusion plate as a semi-finished product. The semi-finished metal extrusion plate can be further processed with grooving and bending to form the support frame. Thus, using the small molds can reduce the manufacturing cost and simplify the manufacturing processes.

To achieve the abovementioned objectives, the present invention discloses a metal extrusion plate for a display stand. The metal extrusion plate extending along a first direction and comprises N of flat plate sections and N−1 of connecting sections, wherein the flat plate sections are integrally formed with the connecting sections, N is a positive integer greater than 1. The flat plate sections are interlaced with the connecting sections, and each of the connecting sections is connected to the two adjacent flat plate sections therebetween. Each of the connecting sections has a groove extending along a second direction being perpendicular to the first direction and forming a first incline and a second incline opposite to the first incline. The metal extrusion plate is capable of being bent at the connecting section so that the two adjacent flat plate sections form a first included angle.

The connecting section is defined with a first block, a second block and a third block which are integrally formed. A side of the first block is connected to one of the two adjacent flat plate sections, a side of the second block is connected to the other one of the two adjacent flat plate sections, and two opposite sides of the third block are connected to the two adjacent flat plate sections respectively. The first block, the second block, and the third block collaboratively define the groove. The flat plate section has a first thickness greater than a second thickness of the third block.

The first incline is formed on the first block, and the second incline is formed on the second block. Before being bent at the connecting section, the first incline and the second incline form a second included angle in which value of the second included angle is complementary to value of the first included angle.

Preferably, in the metal extrusion plate of the present invention, the flat plate section that locates at either end of the metal extrusion plate is formed with a first engagement structure. The metal extrusion plate further comprises a first surface and a second surface opposite to the first surface, wherein the groove is formed on the first surface or the second surface. The material of the metal extrusion plate is aluminum or aluminum alloy.

In another embodiment, the present invention discloses a display stand comprising a base, a supporting frame being formed by bending the abovementioned metal extrusion plate for being disposed on the base, and an elevating module. The flat plate sections and the connecting sections of the supporting frame encompass and form a receiving space. The first incline and the second incline of the connecting section abut against to each other so that the two adjacent flat plate sections form the first included angle. The elevating module is disposed in the receiving space so as to move up and down with respect to the supporting frame.

The display stand further comprises a supporting structure disposed in the receiving space to be secured to the supporting frame. The supporting structure at least abuts against two of the flat plate sections to support the supporting frame.

Preferably, in the display stand of this embodiment, the flat plate section located at either end of the metal extrusion plate is formed with a first engagement structure, and the base has a second engagement structure. The first engagement structure and the second engagement structure are capable of being engaged to each other. The metal extrusion plate further comprises a first surface and a second surface opposite to the first surface, and the groove is formed on the first surface or the second surface. The elevating module further has a slide element and a holder connecting with the slide element. The slide element is capable of sliding along a slide with respect to the supporting frame.

The material of the metal extrusion plate is aluminum or aluminum alloy.

In more detail, in the display stand of this embodiment, each of the connecting sections is defined with a first block, a second block, and a third block, which are integrally formed, wherein a side of the first block is connected to one of the two adjacent flat plate sections, a side of the second block is connected to the other one of the two adjacent flat plate sections, and two opposite sides of the third block are connected to the two adjacent flat plate sections respectively so that the first block, the second block, and the third block collaboratively define the groove, and the flat plate section has a first thickness greater than a second thickness of the third block.

The detailed technology and preferred embodiments implemented for the subject invention are described in the following paragraphs accompanying the appended drawings for people skilled in this field to well appreciate the features of the claimed invention.

DETAILED DESCRIPTION OF THE PREFERRED EMBODIMENT

Figure 2:
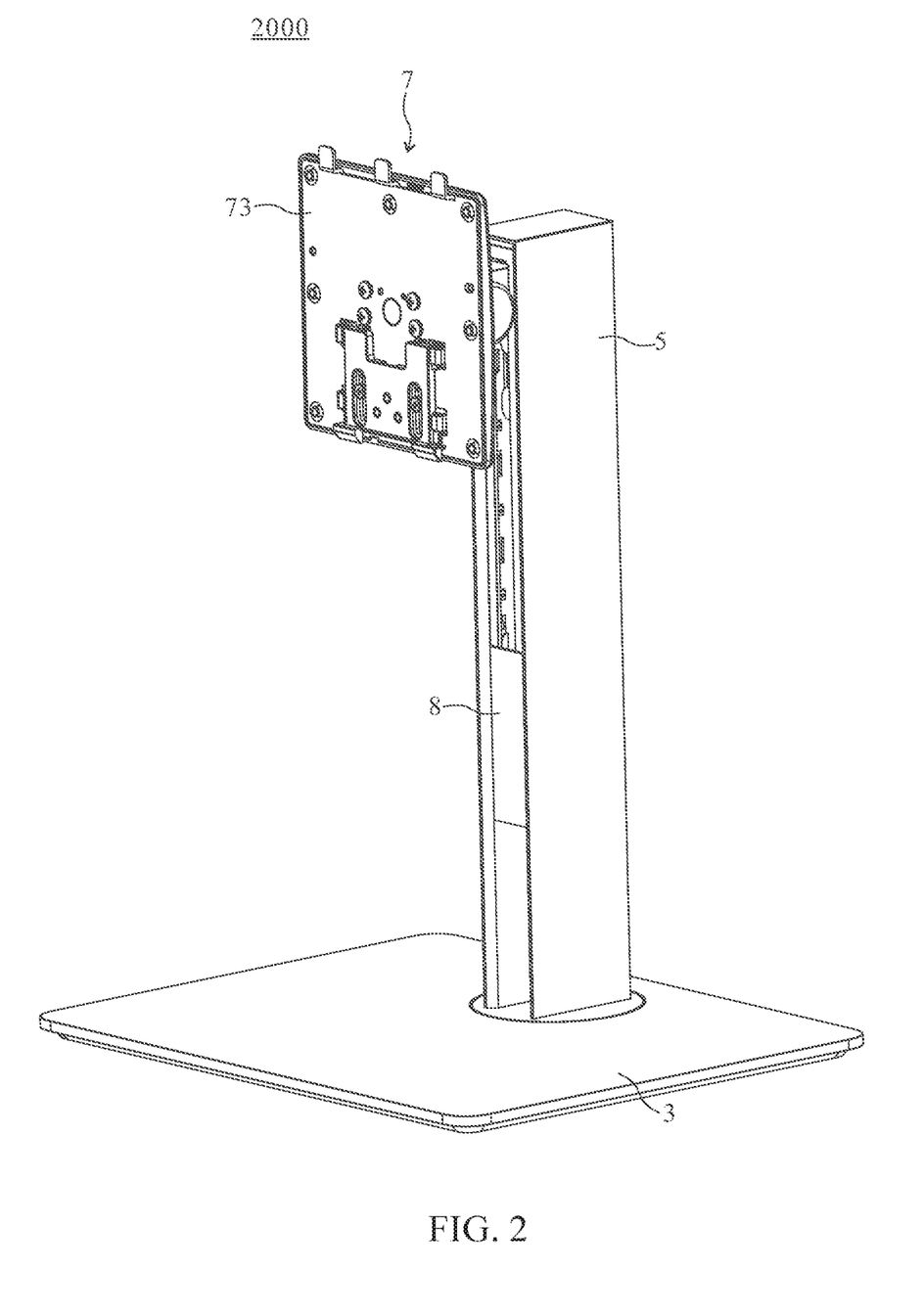
FIG. 2 is a schematic view illustrating the display stand of the present invention.
Figure 3:
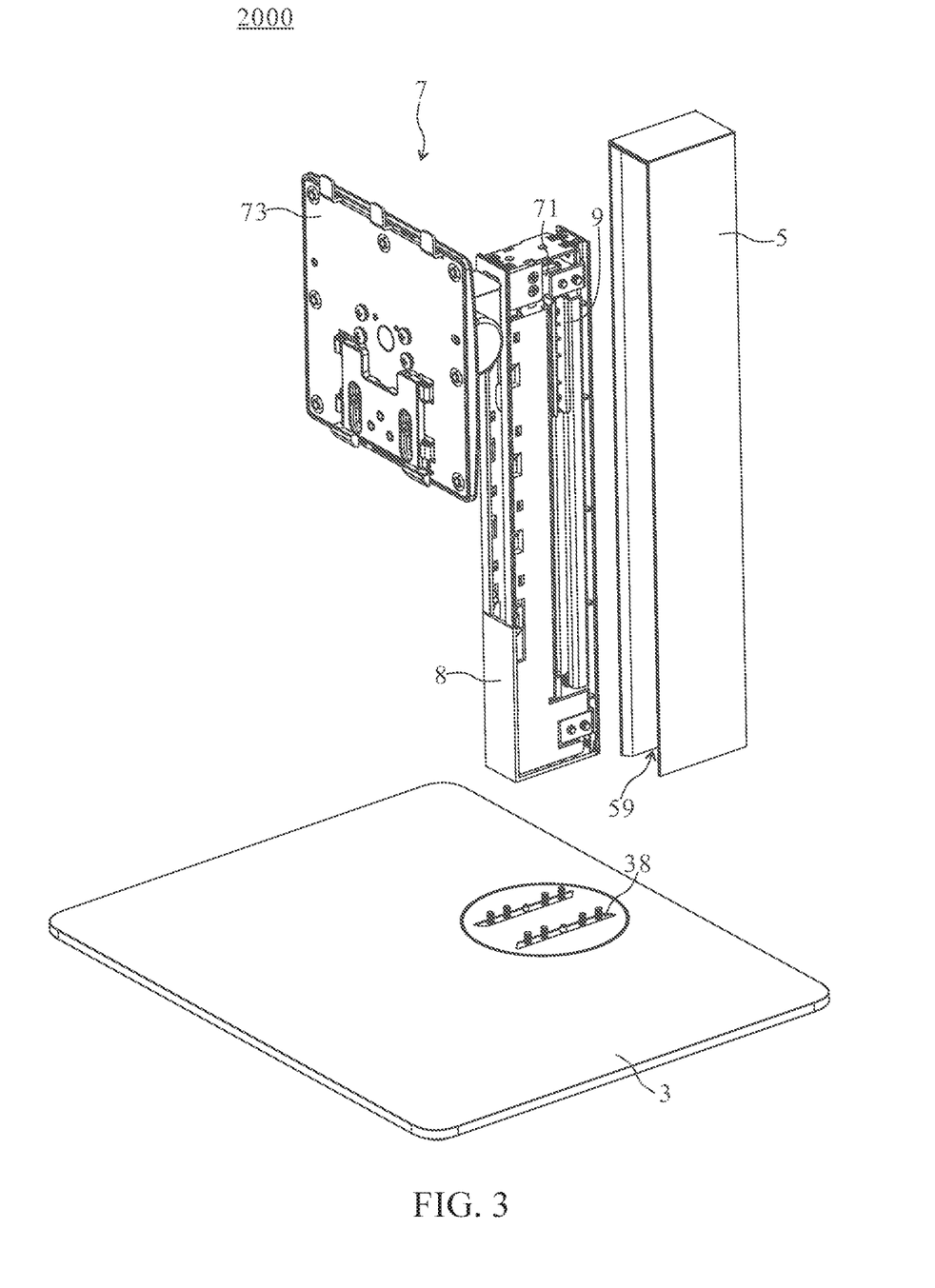
FIG. 3 is an exploded view illustrating the display stand of the present invention.

The present invention discloses a metal extrusion plate and a display stand. Please refer to FIG. 2 and FIG. 3, wherein FIG. 2 shows the schematic view illustrating the display stand 2000, and FIG. 3 shows the exploded view illustrating the display stand 2000. The display stand 2000 preferably includes a base 3, a supporting frame 5, an elevating module 7, and a supporting structure 8. One of the characteristics of the present invention is that the supporting frame 5 is formed by bending the metal extrusion plate, which will be illustrated hereinafter.

Figure 4:
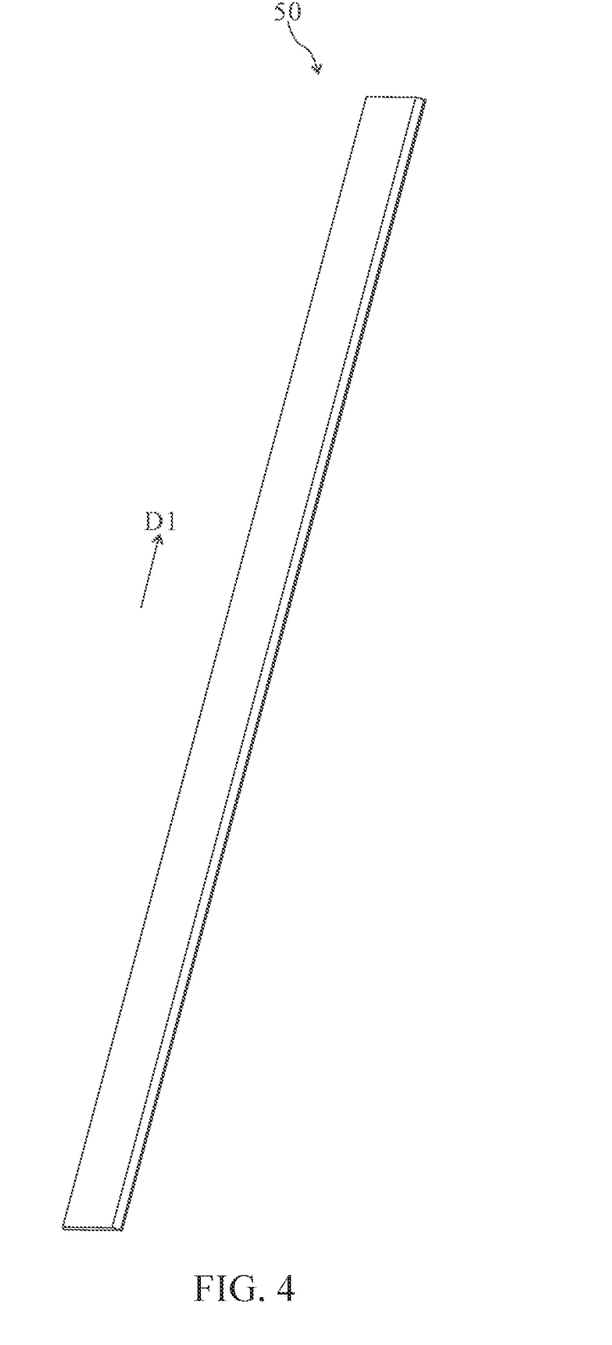
FIG. 4 and FIG. 5 are schematic views illustrating the metal extrusion plate of the present invention.
Figure 5:
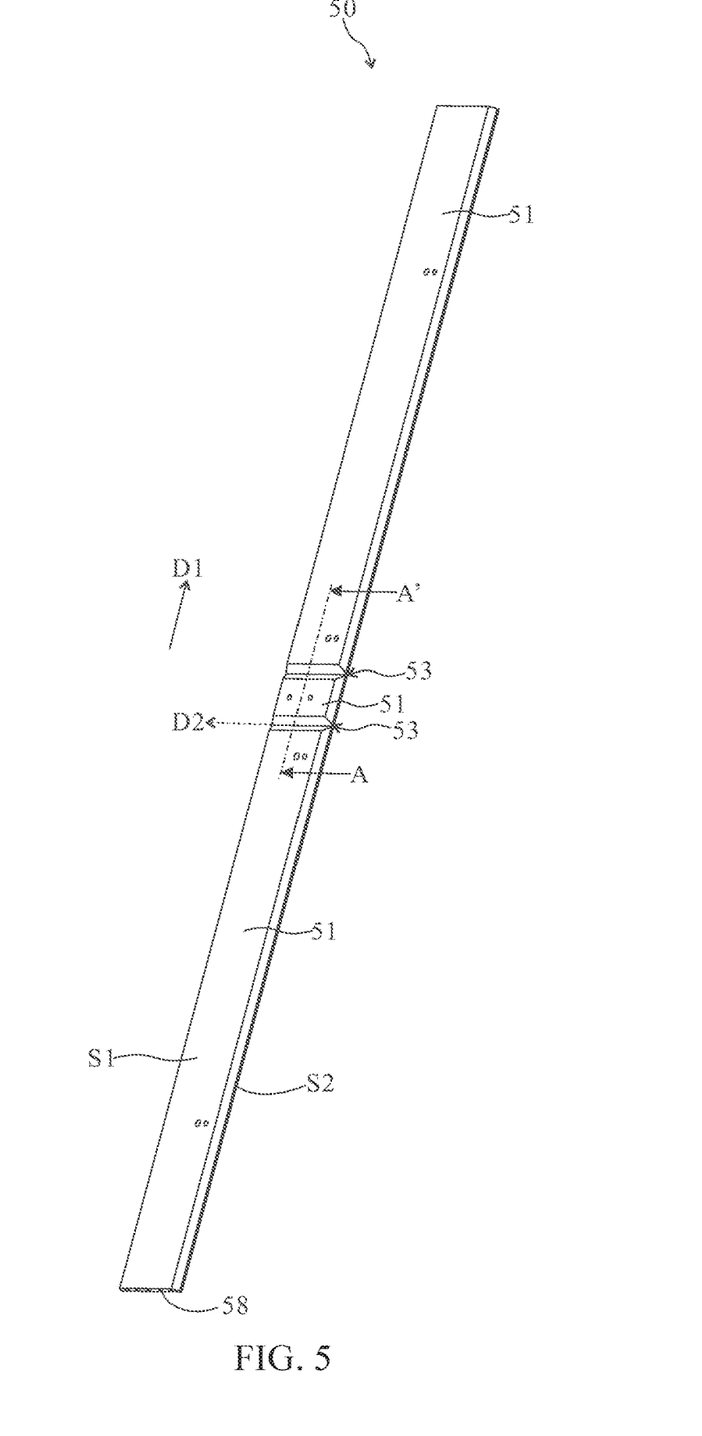
Figure 7:
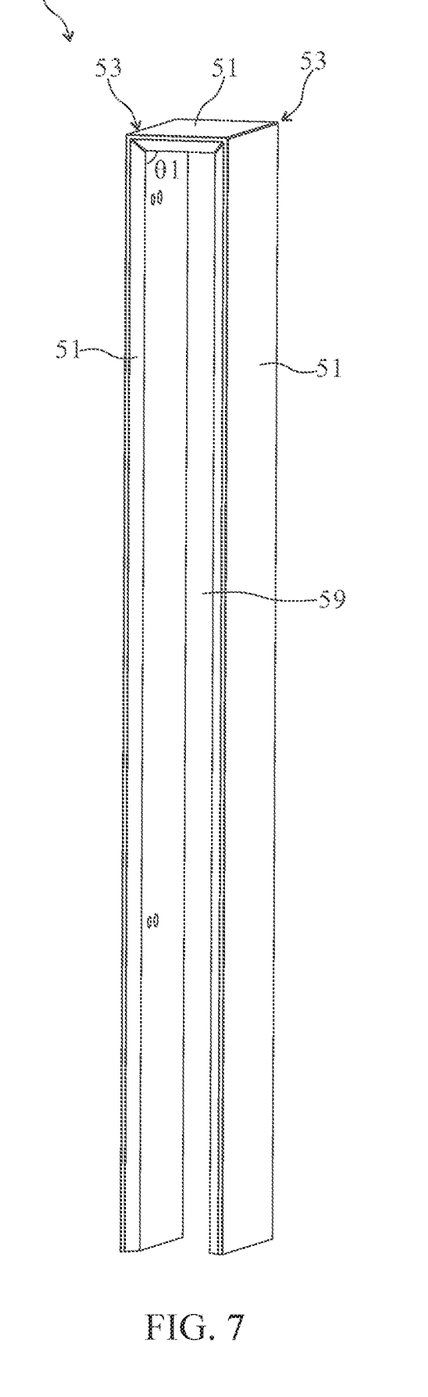
FIG. 7 is a schematic view illustrating supporting frame formed by bending the metal extrusion plate.

In the first embodiment of the present invention, as shown in FIG. 4 and FIG. 5, the metal extrusion plate 50 is disclosed. The metal extrusion plate 50 is manufactured in a manner of metallic extrusion to form an elongated plate extending along a first direction D1. Then, the metal extrusion plate 50 is further processed to form a plurality of flat plate sections 51 and connecting sections 53 which are interlaced and are still integrated. Each of the connecting sections 53 connects the two adjacent flat plate sections 51. Subsequently, the metal extrusion plate 50 is adequately bent at the connecting sections 53 so that the two adjacent flat plate sections 51 form a first included angle θ1 (as shown in FIG. 7). In the present embodiment as shown in FIG. 5, there are three flat plate sections 51 and two connecting sections 53 for illustration. However, in other embodiments, the metal extrusion plate 50 includes N flat plate sections 51 and N−1 connecting sections 53, wherein N is a positive integer greater than 1.

Figure 6:
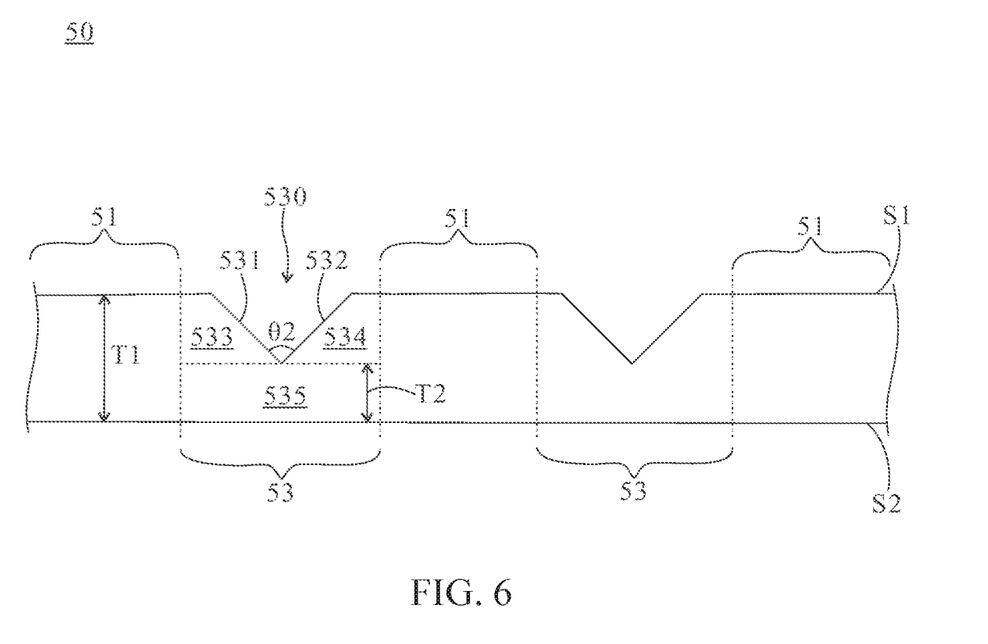
FIG. 6 is a partially enlarged view illustrating the metal extrusion plate of the present invention along the A-A' cross-sectional line in FIG. 5.

FIG. 6 further shows a partially enlarged view along the A-A' cross-sectional line in FIG. 5. Before bending the connecting sections 53, each of the connecting sections 53 is formed with a groove 530 extending along a second direction D2 which is perpendicular to the first direction D1. Each of the grooves 530 forms a first incline 531 and a second incline 532 opposite to the first incline 531. The first incline 531 and the second incline 532 form a second included angle θ2 therebetween.

For the illustration, the connecting section 53 could be further defined with a first block 533, a second block 534, and a third block 535 which are integrally formed. A side of the first block 533 is connected to one of the two adjacent flat plate sections 51. A side of the second block 534 is connected to the other one of the two adjacent flat plate sections 51. Two opposite sides of the third block 535 are connected to the two adjacent flat plate sections 51 respectively. Thus, the first block 533, the second block 534, and the third block 535 collaboratively define the groove 530. The first incline 531 is located on the first block 533, and the second incline 532 is located on the second block 534. Furthermore, the flat plate section 51 has a first thickness T1, and the third block 535 has a second thickness T2, wherein the first thickness T1 is greater than the second thickness T2. That is to say, the groove 530 does not cut off the connecting section 53. The flat plate sections 51 and the connecting section 53 are maintained as being as a whole. The third block 535 should have a sufficient thickness so as to prevent any fraction occurs during or after bending.

As shown in FIG. 7, the aforesaid metal extrusion plate 50 is bent at the connecting section 53 so that the first incline 531 and the second incline 532 abut against each other (that is the first incline 531 and the second incline 532 attach to each other) so that the two adjacent flat plate sections 51 form the first included angle θ1 to form the supporting frame 5 of the display stand 2000. It is understandable that the first included angle θ1 is the supplementary angle of the second included angle θ2, and vice versa. In the present embodiment, the first included angle θ1 and the second included angle θ2 are both about 90 degrees.

Please refer to FIG. 5. Preferably, at the two ends of the metal extrusion plate 50, either of the flat plate section 51 is formed with a first engagement structures 58. The first engagement structures 58 could be easily formed as a notch or a protrusion by post-processing. Furthermore, the metal extrusion plate 50 comprises a first surface S1 and a second surface S2 opposite to the first surface S1. In this embodiment, the groove 530 is formed on the first surface S1; however, in other embodiments, the groove 530 could be formed on the second surface S2. Preferably, the material of the metal extrusion plate 50 is aluminum or aluminum alloy.

With reference to FIG. 2, FIG. 3, and FIG. 7, the second embodiment of the present invention discloses the supporting frame 5 of the display stand 2000. The metal extrusion plate 50 is bent to form the supporting frame 5 which is disposed on the base 3. Thus, the flat plate sections 51 and the connecting sections 53 encompass and form a receiving space 59. The elevating module 7 is disposed in the receiving space 59 so as to move up and down with respect to the supporting frame 5.

The supporting structure 8 is, but not limited, an iron frame disposed in the receiving space 59 and fastened to the supporting frame 5. In this embodiment, the supporting structure 8 abuts against all the flat plate sections 51 of the supporting frame 5 to enhance the overall strength. Practically, the objective of enhancing structural strength is achieved through that the supporting structure 8 abuts against at least two of the flat plate sections 51. The base 3 further has a second engagement structure 38 which could be, for example, protrusions or screws. The first engagement structures 58 of the supporting frame 5 are adapted to engage to the second engagement structure 38 so that the supporting frame 5 could be secured onto the base 3.

The elevating module 7 further comprises a slide element 71 and a holder 73 connected to the slide element 71. The slide element 71 slides along a slide 9 with respect to the supporting frame 5. The slide element 71 and the slide 9 are both disposed on the supporting structure 8, and the holder 73 is utilized to connect to a display (not shown).

Figure 8:
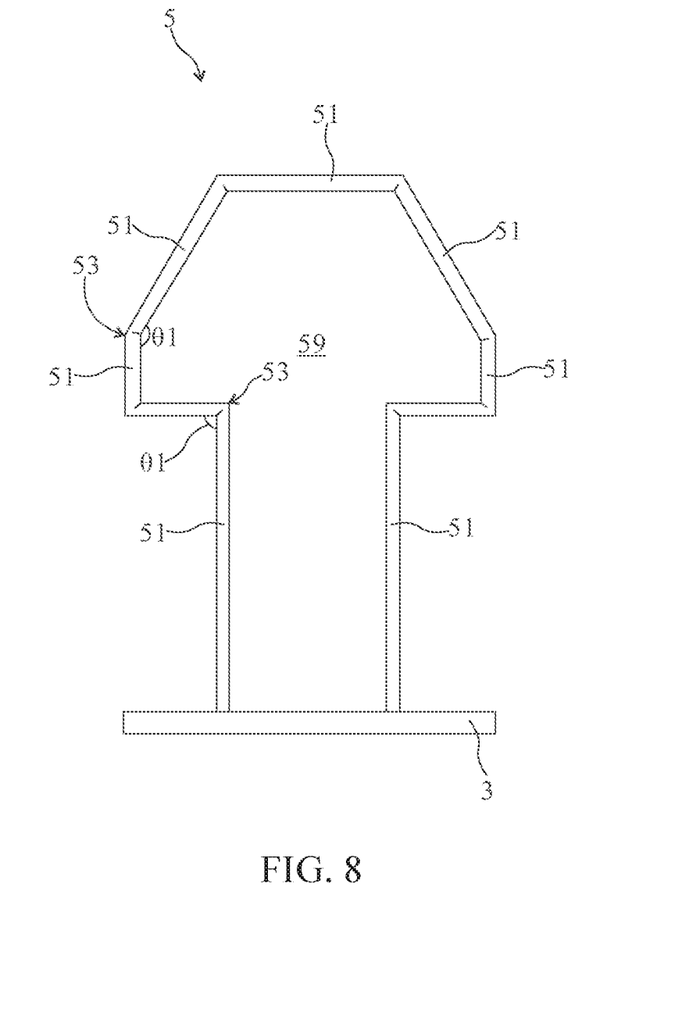
FIG. 8 is a schematic view illustrating another embodiment of the present invention.

The third embodiment of the present invention is shown in FIG. 8. The difference is that the grooves 530 could be optionally formed on the first surface S1 or the second surface S2 so that the supporting frame 5 may have more variations to meet the user's requirements. As shown in FIG. 8, a plurality of flat plate sections 51 and connecting sections 53 are integrally formed and bent as the supporting frame 5. Because a portion of the grooves 530 of the metal extrusion plate 50 are formed on the first surface S1 and others are formed on the second surface S2, the bending orientations could be changed. Moreover, the second included angle θ2 of the metal extrusion plate 50 could also be varied according to the requirements. The first included angles θ1 shown in FIG. 8 include right angles with 90 degrees, and obtuse angles larger than 90 degrees. For example, if one of the first included angles θ1 is required in 120 degrees, the second included angle θ2 at the groove 530 is designed as 60 degrees before bending.

It could be understood that the metallic extrusion processes for manufacturing the metal extrusion plate 50 merely need small molds. Actually, the molds merely need to meet the requirements of the cross-section of the metal extrusion plate 50. The subsequent manufacture processes of grooving and bending are both simple so that the costs of manufacture can be reduced as well as a slim stand can be obtained.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A display stand, comprising:
a base;
a supporting frame, being formed by bending a metal extrusion plate which is originally extending along a first direction and comprising N flat plate sections and N-1 connecting sections, wherein the flat plate sections are integrally formed with the connecting sections, N is positive integer greater than 1, the flat plate sections are interlaced with the connecting sections, each of the connecting sections is connected to and configured between the two adjacent flat plate sections, and each of the connecting sections has a groove extending along a second direction being perpendicular to the first direction and forming a first incline and a second incline opposite to the first incline wherein the metal extrusion plate is capable of being bent at the connecting sections so that the first incline and the second incline of the connecting section abut against each other and the two adjacent flat plate sections form a first included angle, and the supporting frame being erected on the base so that the flat plate sections and the connecting sections encompass and form a receiving space; and
a supporting structure being disposed in the receiving space to be secured to the supporting frame, wherein the supporting structure abuts against at least two of the flat plate sections with surface contact to enhance a strength of the supporting frame.

2. The display stand as claimed in claim 1, wherein the supporting structure further comprises at least two opposite lateral outer surfaces which abut against the flat plate sections with surface contact respectively.

3. The display stand as claimed in claim 2, wherein the supporting structure is formed with an assembling structure for a front cover of the display stand being disposed thereto.

4. The display stand as claimed in claim 3, wherein the assembling structure includes a plurality of apertures for receiving a plurality of protrusions of the front cover so as to install the front cover to the supporting structure.

5. The display stand as claimed in claim 4, wherein the assembling structure further includes a plurality of recesses being formed on the lateral outer surfaces.

6. The display stand as claimed in claim 4, wherein the supporting structure includes two side boards being spaced apart with each other, and a back board connecting with the side boards, wherein each of the side board is defined with a first area distant from the back board and a second area adjacent to the back board, wherein the assembling structure is located at the first area.

7. The display stand as claimed in claim 6, wherein the side boards and the back board collectively form an accommodating space, and the protrusions extend into the accommodation space to engage with the apertures correspondingly.

8. The display stand as claimed in claim 6, wherein the side boards and the back board are integrally formed.

9. The display stand as claimed in claim 6, wherein the second area has a hollow portion located between the back board and the first area.

10. The display stand as claimed in claim 4, wherein the front cover includes an upper section and a lower section connecting to the upper section so that the front cover partially overlaps a front opening of the receiving space.

11. The display stand as claimed in claim 10, wherein the upper section is partially hollow for accessing the receiving space, wherein the protrusions are formed at the upper section.

12. The display stand as claimed in claim 10, wherein the front cover further includes a bottom section extending from the lower section, wherein the bottom section is located below the side boards and the back board.

13. The display stand as claimed in claim 3, wherein the flat plate section located at either end of the metal extrusion plate is formed with a first engagement structure, and the base has a second engagement structure so that the first engagement structure and the second engagement structure are engaged to each other.

14. The display stand as claimed in claim 3, further comprising an elevating module, being disposed in the receiving space so as to move up and down with respect to the supporting frame.

15. The display stand as claimed in claim 14, wherein the elevating module further has a slide element and a holder connected to the slide element, and the slide element slides along a slide with respect to the supporting frame.

16. The display stand as claimed in claim 15, wherein the holder is configured for connecting to a display.

17. The display stand as claimed in claim 3, wherein when the metal extrusion plate originally extends along the first direction before being bent, the first incline and the second incline form a second included angle in which value of the second included angle is complementary to value of the first included angle.

18. The display stand as claimed in claim 17, wherein the metal extrusion plate further comprises a first surface and a second surface opposite to the first surface, and the groove is formed on the first surface or the second surface.

19. The display stand as claimed in claim 3, wherein the material of the metal extrusion plate is aluminum or aluminum alloy.

20. The display stand as claimed in claim 3, wherein each of the connecting sections is defined with a first block, a second block, and a third block, which are integrally formed, wherein a side of the first block is connected to one of the two adjacent flat plate sections, a side of the second block is connected to the other one of the two adjacent flat plate sections, and two opposite sides of the third block are connected to the two adjacent flat plate sections respectively so that the first block, the second block, and the third block collaboratively define the groove, and the flat plate section has a first thickness greater than a second thickness of the third block.

* * * * *